United States Patent [19]

Maier

[11] 4,310,794

[45] Jan. 12, 1982

[54] CAPACITIVE PROBE DETECTION SYSTEMS

[75] Inventor: Lawrence C. Maier, Middlebury, Vt.

[73] Assignee: Simmonds Precision Products, Inc., Tarrytown, N.Y.

[21] Appl. No.: 932,391

[22] Filed: Aug. 9, 1978

Related U.S. Application Data

[63] Continuation of Ser. No. 854,574, Nov. 25, 1977, abandoned.

[51] Int. Cl.³ ............................................. G01R 27/26
[52] U.S. Cl. ................................. 324/61 R; 324/60 C
[58] Field of Search ........................... 324/61 R, 60 C

[56] References Cited

U.S. PATENT DOCUMENTS 3,713,022 1/1973 McRay .............................. 324/60 C

Primary Examiner—Stanley T. Krawczewicz
Attorney, Agent, or Firm—Edwin E. Greigg

[57] ABSTRACT

A capacitive probe detection system is described which incorporates a synchronous switching system to switch the current flow through a capacitive probe to a signal integrating circuit only during the whole of every positive half cycle of the current flow attributable to the capacitive component of the probe. In this way that current due to the resistive component of the probe and to spurious noise pulses is eliminated by the integrator when performing its integrating action.

3 Claims, 2 Drawing Figures

FIG. I.

CAPACITIVE PROBE DETECTION SYSTEMS

This is a continuation, of application Ser. No. 854,574, filed Nov. 25, 1977 now abandoned.

BACKGROUND OF THE INVENTION

1. Field of the Invention

The invention relates to capacitive probe detection systems for providing an output signal indicative of the instantaneous capacitance of a probe located in an environment where varying environmental conditions vary the probe capacitance accordingly.

2. Description of the Prior Art

Capacitive probe detection systems are known for use in liquid level sensing systems where the capacitance of the probe varies with the level of a liquid. In such systems, a capacitive probe is excited by A.C. signals and the current flow through the probe is then amplified, rectified and filtered to provide a DC output signal which is representative of the liquid level. Such systems are generally inaccurate since a variation in liquid level not only changes the capacitance of the probe but also the resistive component. Furthermore, such systems are rendered inaccurate by spurious noise. It is known to reduce the noise factor by using screened leads but this has not been found totally satisfactory. The use of screened leads adds to the complexity of the system and therefore to the cost.

It is an object of the invention to provide an improved capacitive probe detection system.

It is a more specific object to provide a capacitive probe detection system which minimizes the effect of noise and the resistive component of the probe to provide a more accurate detection system.

SUMMARY OF THE INVENTION

According to the invention there is provided a capacitive probe detection system, comprising a probe including a capacitive component and a resistive component having component values which vary with variations in the environment in which the probe is located, a source of A.C. voltage connected to energize the probe, an integrator, switching means connected between the probe and the integrator, and control means connected to control the operation of the switching means in response to the phase of the A.C. voltage, whereby to connect the probe to the integrator only during each alternate 180° peak-to-peak transition of the A.C. voltage.

According to the invention there is further provided a capacitive probe detection system comprising a capacitive probe, a first electronic switch, an A.C. source, means connecting the probe and the switch in series across the A.C. source, a second electronic switch, an integrator, means connecting the switch and the integrator in series to the junction between the probe and the first switch, phase shifting means connected to the A.C. source to provide a signal shifted by 90° with respect to that of the A.C. source, a squarer connected to receive the phase shifted signal and to generate a square wave signal in dependence thereon, a first drive responsive to the square wave signal to switch the second switch ON only during the square wave pluses of the squarer, an invertor connected to receive the square wave signal and arranged to provide an inverted square wave signal, and a second drive responsive to the square wave pulses of inverted square wave signal to switch the first switch ON only during the square wave pulses of the inverted square wave signal.

BRIEF DESCRIPTION OF THE DRAWING

A capacitive probe detection system embodying the invention will now be described, by way of example, with reference to the accompanying drawing in which.

DESCRIPTION OF THE PREFERRED EMBODIMENTS

Figure 1:
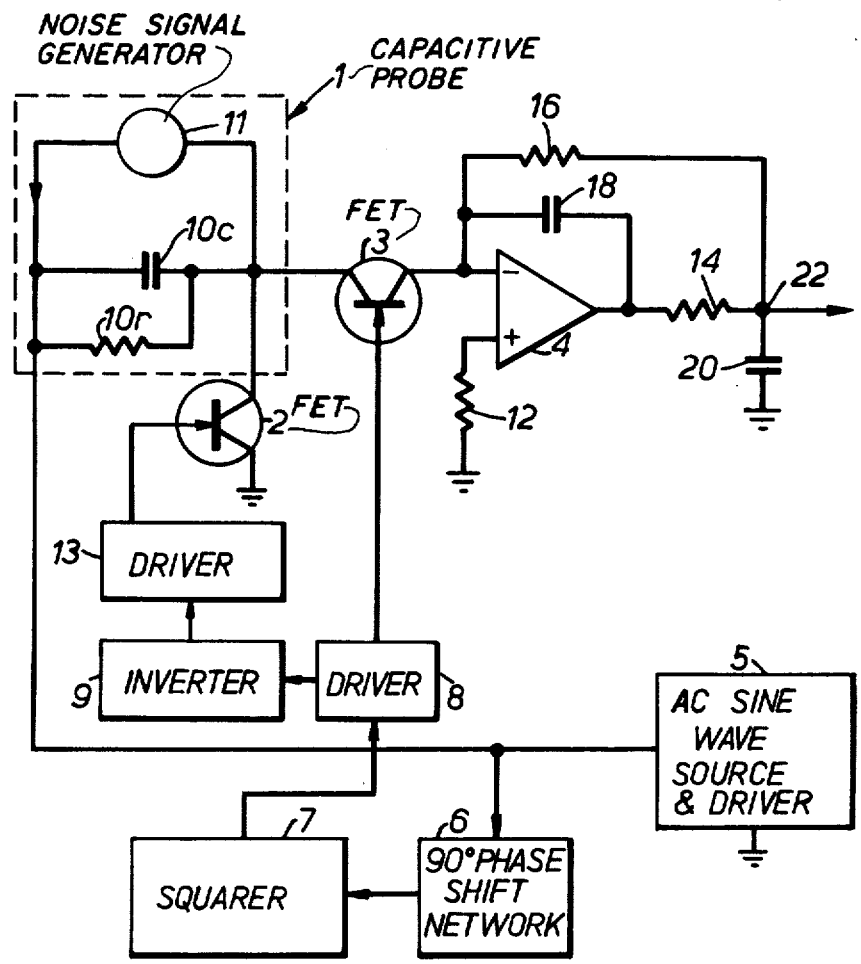
FIG. 1 is a circuit diagram of the system.

The system includes a capacitive probe 1 which is of any suitable conventional construction and can be electrically represented by a capacitive component 10c, a resistive component 10r, and a noise signal generator 11 (representing noise signals picked up by the probe) all connected in parallel. The probe 1 is connected in series with the source-drain path of a field effect transistor (FET) 2 and the series combination of the probe 1 and FET 2 are connected across an A.C. source 5. The A.C. source also supplies a phase shifter 6 which shifts the phase of the A.C. signal through 90°, and the output of the phase shifter 6 feeds a squarer 7 in the form of a conventional comparator which is adapted to generate a square wave in response to the phase shifted sinusoidal waveform. The square wave (see waveform 2B in FIG. 2) is such that the leading edge of each square wave pulse is coincident with the maximum positive excursion of the sinusoidal waveform Vs of the source (see waveform 2A in FIG. 2) and the trailing edge is coincident with the maximum negative excursion of the sinusoidal waveform. Thus the square wave lags the source sinusoidal waveform by 90°. The output of the squarer 7 triggers a transistor driver 8. The transistor driver 8 has two outputs, one output controlling the control electrode of another field effect transistor (FET) 3 while the other output triggers an inverter 9. The output of the inverter 9 feeds a driver 13 which in turn controls the control electrode of the FET 2.

The source-drain path of the FET 3 couples the junction between the probe 1 and FET 2 with one input of a differential amplifier 4. The other input of the differential amplifier 4 is grounded through a resistor 12. A feedback capacitor 18 couples the output of the amplifier 4 to its first input and a feedback resistor 16 couples the output terminal 22 to the first input of the amplifier 4. The output terminal 22 is connected to ground through a capacitor 20.

The differential amplifier 4 together with its associated resistors and capacitors acts as an integrator to integrate the output signal from the transistor 3.

Figure 2:
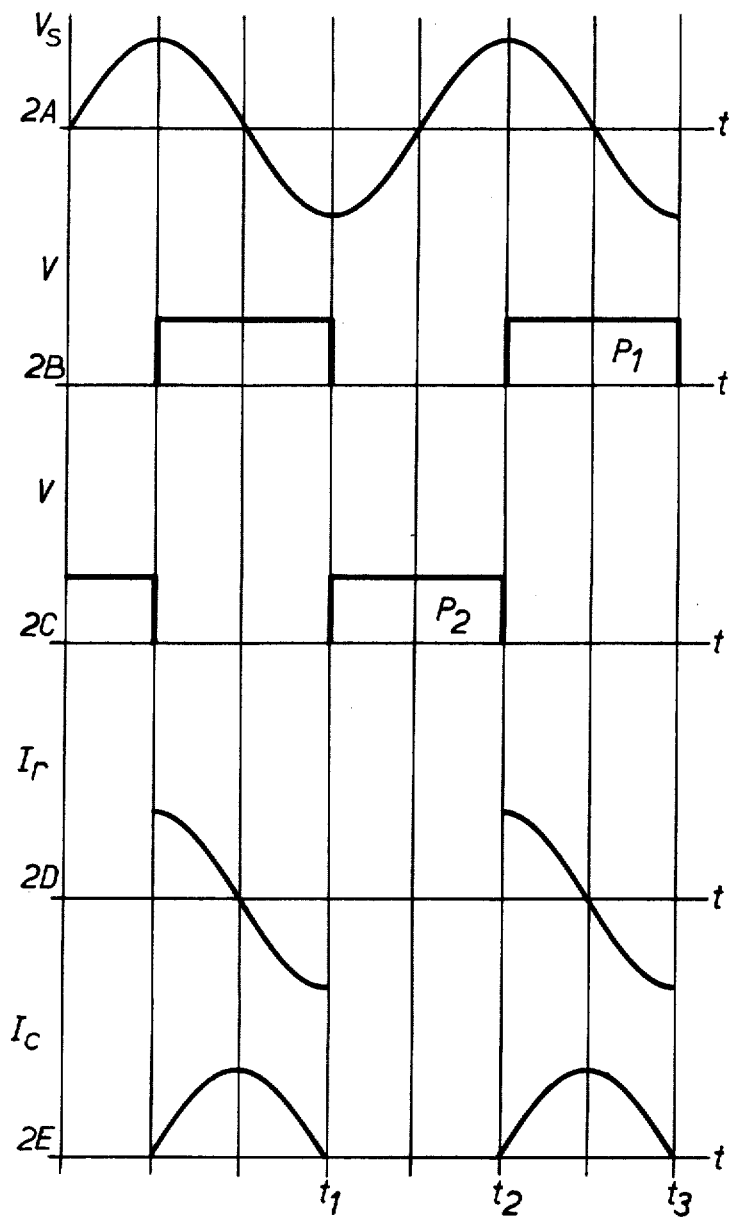
FIG. 2 is a diagram illustrating waveforms at various points in the circuit of FIG. 1.

In operation, when the probe 1 is energized by the A.C. source the drivers 13 and 8 produce alternate pulses $P_1$ and $P_2$ (see FIG. 2). Thus at instant $t_1$ when the A.C. source voltage Vs (waveform 2A) reaches a negative peak the FET 3 is turned OFF and the FET 2 is turned ON. Half a cycle later at time $t_2$ when the source voltage Vs reaches a positive peak, pulse $P_1$ is generated to turn FET 3 ON and FET 2 is turned OFF. Thus FET 3 only opens during each of those half cycles when the source voltage passes from its positive to its negative peak. During this period the current Ir (waveform 2D) flowing through the resistive component 10r and which is in phase with the supply voltage also passes from a positive to a negative peak. However, the current Ic flowing through the capacitive component 10c is 90° out of phase with the supply voltage during this period and so has no negative excursion but rises from zero level to a maximum and back to zero level again.

Therefore, the current Ir (see FIG. 2D) which is passed by FET 3 to the integrator will have zero net value when integrated, while the current Ic (see waveform 2E) when integrated will have a net value which will be proportional to the instantaneous magnitude of the capacitive component 10c. In this way the system is rendered insensitive to any changes in the resistive component 10r.

In so far as signals generated by the noise generator 11 are concerned these will have a random frequency and the chopping action of the FET 3 on these signals will in relative terms be a random chopping action. Consequently, when the randomly chopped noise signals are integrated the net output is likely to be zero. The need for screening of the cables to and from the probe is thus reduced or obviated.

Thus the signal appearing at the output terminal 22 is substantially completely devoid of any influence produced by the resistive component of the probe and any noise signal picked up by the probe, and so provides an accurate representation of the instantaneous capacitance of the probe.

While the system described can be advantageously used as a liquid level sensing arrangement, it will be appreciated that the system can be used in other applications in which a changing environmental condition will vary the capacitance of the probe.

Many modifications can be made to the invention without departing from the spirit and scope of the invention as defined by the appended claims.

What is claimed is:

1. In a capacitive probe detection system for providing an output signal indicative of an environmental condition, including a probe which includes a capacitive component and a resistive component having component values which vary with variations in the environment in which the probe is located, an alternating voltage source, circuit means for continuously connecting the alternating voltage source to energize the probe, and current sensing means for sensing at least a portion of the current flowing through the probe, the improvement wherein the circuit means comprises:
   a first current path which extends between the probe and the alternating voltage source and includes a first electrically actuated switching means for opening or closing the first current path;
   a second current path, which extends in parallel with the first current path between the probe and the alternating voltage source, and which includes a second electrically actuating switching means for opening and closing the second current path; and
   control means for simultaneously opening the first switching means and closing the second switching means during alternate 180° peak-to-peak portions of the alternating voltage signal, which includes
      a phase shift circuit connected to the alternating voltage source to provide a voltage signal 90° out of phase with the alternating voltage signal,
      a squaring circuit connected to receive the voltage signal from the phase shift circuit to produce a first square wave,
      first switch actuating means for opening and closing the first switching means in response to the first square wave, and
      second switch actuating means for opening and closing the second switching means in response to the first square wave; and the current sensing means comprises:
   signal integrating means, which is disposed in the first current path, for providing an output voltage signal which is proportional to an integrated value of the current flowing in the first current path, and which constitutes the system output signal.

2. A system as defined in claim 1 wherein the signal integrating means comprises a differential amplifier having an integrating feedback circuit.

3. A system as defined in claim 1, wherein:
   the first switch actuating means comprises a first driver circuit connected between the first switching means and the squaring circuit to receive the first square wave such that the first switching means is closed during positive pulses of the first square wave; and
   the second switch actuating means includes
   an inverter connected to receive the first square wave and to produce a second square wave 180° out of phase with the first square wave, and
   a second driver circuit connected between the second switching means and the inverter to receive the second square wave such that the second switching means is closed during the positive pulses of the second square wave.

* * * * *